(12) United States Patent
Lan et al.

(10) Patent No.: US 6,187,692 B1
(45) Date of Patent: Feb. 13, 2001

(54) METHOD FOR FORMING AN INSULATING FILM

(75) Inventors: Shih-Ming Lan; Chun-Liang Liu, both of Hsinchu; Andrew Lin, Miao-Li Hsien; Hsien-Liang Meng, Hsinchu, all of (TW)

(73) Assignee: United Silicon Incorporated, Hsinchu (TW)

( * ) Notice: Under 35 U.S.C. 154(b), the term of this patent shall be extended for 0 days.

(21) Appl. No.: 09/187,112

(22) Filed: Nov. 5, 1998

(30) Foreign Application Priority Data

Sep. 14, 1998 (TW) .................................................. 87115243

(51) Int. Cl.⁷ ...................................................... H01L 21/31
(52) U.S. Cl. ............................. 438/778; 438/790; 438/787
(58) Field of Search .................................. 438/790, 787, 438/778

(56) References Cited

U.S. PATENT DOCUMENTS 5,716,891 * 2/1998 Kodama .
5,804,509 * 9/1998 Cho .
5,908,308 * 6/1999 Barsan et al. .
5,943,599 * 8/1999 Yao et al. .

\* cited by examiner

Primary Examiner—John F. Niebling
Assistant Examiner—Josetta Jones
(74) Attorney, Agent, or Firm—J. C. Patents; Jiawei Huang

(57) ABSTRACT

A method for forming an insulating layer to solve a problem of non-uniform thickness of the insulating layer is provided. The method includes forming a first insulating layer over a substrate preferably by chemical vapor deposition (CVD) at an operation temperature of about 200° C.–350° C. The thickness of the first insulating layer is about 500 Å–5000 Å. A second insulating layer is formed over the first insulating layer preferably by CVD at a temperature of about 350° C.–500° C. The thickness of the second insulating layer is about 1000 Å–10000 Å. The first and the second insulating layers form together as an insulating layer to insulate transistors and isolation structures from the interconnect metal layer.

20 Claims, 4 Drawing Sheets

METHOD FOR FORMING AN INSULATING FILM

CROSS-REFERENCE TO RELATED APPLICATION

This application claims the priority benefit of Taiwan application serial no. 87115243, filed Sep. 14, 1998, the full disclosure of which is incorporated herein by reference.

BACKGROUND OF THE INVENTION

1. Field of the Invention

This invention relates to semiconductor fabrication, and more particularly to a method for forming a thin insulating layer, which includes non-doped silicate glass (NSG) and is formed by two different temperatures.

2. Description of Related Art

In a semiconductor fabrication process with high integration, a stack structure is commonly used to increase device integration. The stack structure typically includes a device part, such as a metal-oxide semiconductor (MOS) transistor on a substrate and multiple over the substrate. Several insulating structures are needed for a purpose of isolation. For example, a field oxide (FOX) layer formed by a local oxidation (LOCOS) process on the substrate or a shallow trench isolation (STI) structure formed in the substrate is used to isolate the MOS transistor. Above the MOS transistor and the FOX layer, an insulating layer is necessary to be formed over the substrate to isolate the MOS transistor from the first layer of the interconnect metal layers. The insulating layer usually is made of tetra-ethyl-ortho-silicate (TEOS) silicon oxide because it has better step coverage and planarization capability.

FIG. 1A and FIG. 1B are cross-section views of a portion on a substrate, schematically illustrating a conventional fabrication process for forming an insulating layer over the substrate that includes a FOX structure. In FIG. 1A, a FOX layer 116 is formed on a surface of a semiconductor substrate 100 to isolate a MOS transistor 105, which includes a gate structure 115, two interchangeable source/drain regions 112, 114. The gate structure 115 includes a gate 110 on the substrate 100 and a spacer 111 on each side of the gate 110. The interchangeable source/drain regions 112, 114 have a lightly doped drain (LDD) structure. In FIG. 1B, a metallization process is performed by first forming an insulating layer 118 over the substrate 100 in order to isolate the MOS transistor 105 from a metal layer (not shown) formed subsequently over the insulating layer 218. The insulating layer 118 includes non-doped silicate glass (NSG), such as silicon oxide formed by using TEOS gas as a reaction gas in a chemical vapor deposition (CVD) process. The operation temperature is about between 400° C. and 500° C., and the operation pressure is about between 1 and 10 torrs.

FIG. 2A and FIG. 2B are cross-section views of a portion on a substrate, schematically illustrating a conventional fabrication process for forming an insulating layer the substrate that includes a STI structure. In FIG. 2A, a shallow trench isolation (STI) structure 216 is formed in a semiconductor substrate 200 to isolate a MOS transistor 205, which includes a gate structure 215, two interchangeable source/drain regions 212, 214. The gate structure 215 includes a gate 210 on the substrate 200 and a spacer 211 on each side of the gate 210. The interchangeable source/drain regions 212, 214 have a lightly doped drain (LDD) structure. In FIG. 2B, a metallization process is performed by first forming an insulating layer 218 over the substrate 200 in order to isolate the MOS transistor 205 from a metal layer (not shown) formed subsequently over the insulating layer 218. The insulating layer 218 includes NSG, such as silicon oxide formed by using TEOS gas as a reaction gas in a chemical vapor deposition (CVD) process. The operation temperature is about between 400° C. and 500° C., and the operation pressure is about between 1 and 10 torrs.

However, in FIG. 1B and FIG. 2B, the substrates 100, 200 include silicon and do not absorb water vapor. The FOX layer 116 and the STI structure 216 include oxide and have a strong property of absorbing water vapor. When the insulating layers 118, 218 are formed over the substrates 100, 200 by the conventional method, the deposition rate on the substrates 100, 200 is larger than that on the FOX layer 116 and the STI structure 216. This causes a non-uniform thickness of the insulating layers 118, 218. A surface sensitivity defined as a quantity of T1/T2 is used to estimate the step coverage capability of the insulating layers 118, 218. T1 is a thickness of the insulating layers 118, 218 at a portion above the FOX layer 116 or the STI structure 216, and T2 is a thickness of the insulating layers 118, 218 at a portion above the substrates 100, 200. By a conventional fabrication method, T1 is usually about 2500 Å–3200 Å, and T2 is usually about 4000 Å–5000 Å so that the surface sensitivity is about 62%, which implies a non uniform thickness. A severe non-uniform thickness does certainly affect subsequent fabrication processes. Moreover, a large number of voids 130 can occur on the insulating layers 118, 218 at a portion above the FOX layer 116 and the STI structure 216. The voids 130 can easily absorb water vapor and cause a failure of insulating function.

SUMMARY OF THE INVENTION

It is therefore an objective of the present invention to provide a method for forming an insulating layer, which can solve a problem of non-uniform thickness of the insulating layer, which includes NSG, such as a TEOS silicon oxide.

In accordance with the foregoing and other objectives of the present invention, a method for forming an insulating layer to solve a problem of non-uniform thickness of the insulating layer is provided. The method includes forming a first insulating layer over a substrate preferably by chemical vapor deposition (CVD) at a first operation temperature, which is lower than a conventional temperature. The thickness of the first insulating layer is thinner than a conventional thickness. The substrate includes, for example, a MOS transistor and an isolation structure to isolate the MOS transistor. A second insulating layer is formed over the first insulating layer preferably by CVD at a second temperature, which is higher than the first operation temperature. The thickness of the second insulating layer is larger and is sufficient large to achieve an insulating purpose.

BRIEF DESCRIPTION OF DRAWINGS

The invention can be more fully understood by reading the following detailed description of the preferred embodiments, with reference made to the accompanying drawings as follows.

DETAILED DESCRIPTION OF PREFERRED EMBODIMENTS

A method of the invention for forming an insulating layer is proposed, in which the insulating layer is formed by two stages each with different thickness and different operation temperature. The insulating layer of the invention can solve the conventional problem of non-uniform thickness of the insulating layer, which includes NSG, such as a TEOS silicon oxide.

Example 1

Figure 3A:
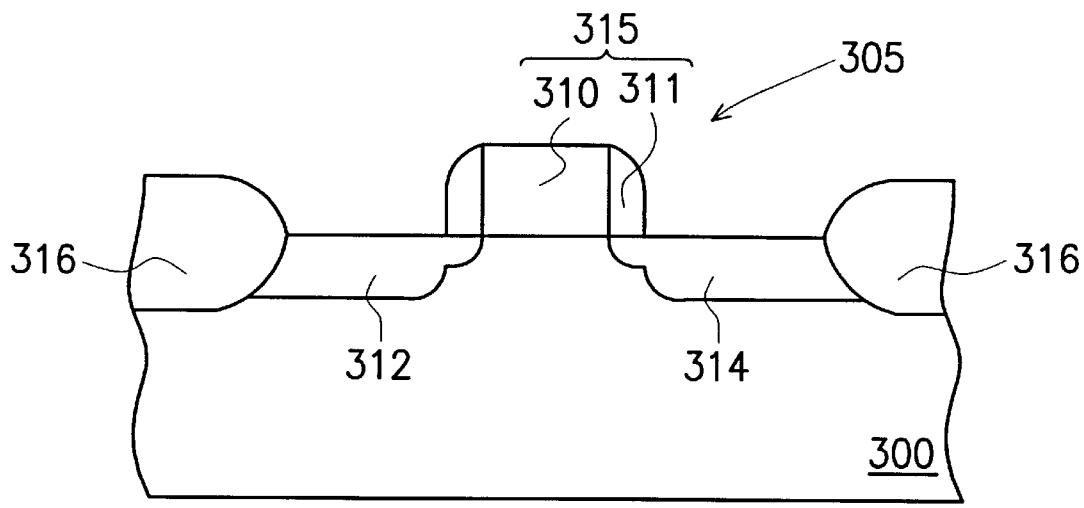
FIGS. 3A–3C are cross-section views of a portion on a substrate, schematically illustrating a fabrication process for forming an insulating layer over the substrate, which includes a FOX structure, according to a first preferred embodiment of the invention.
Figure 3B:
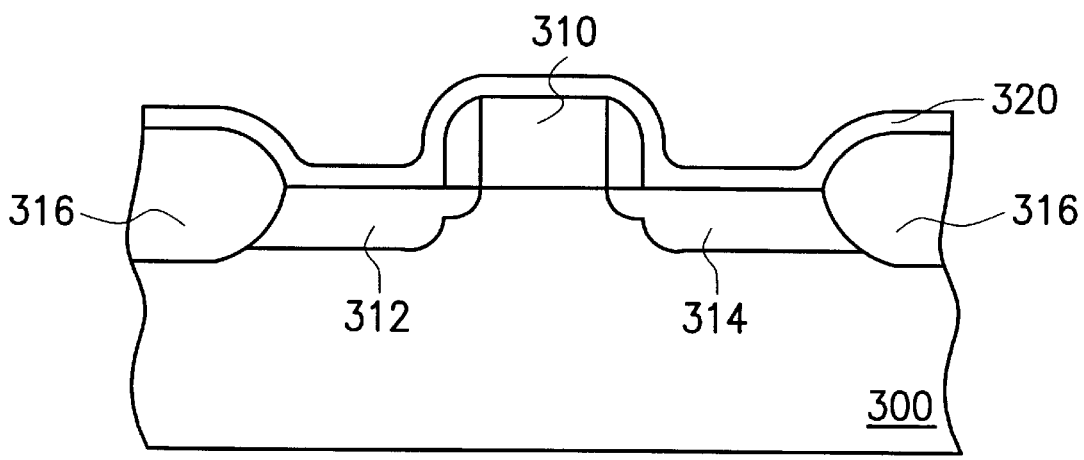
Figure 3C:
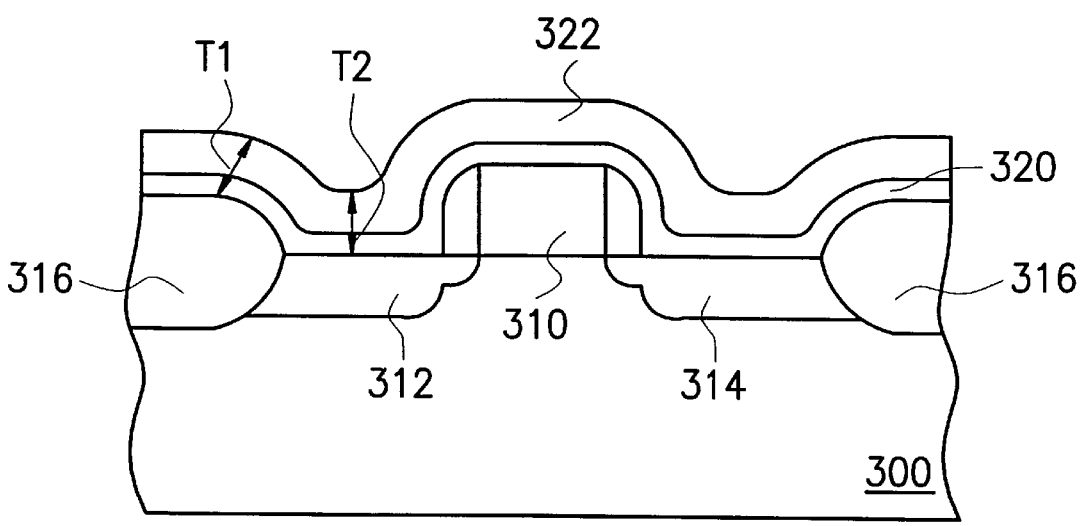

FIGS. 3A–3C are cross-section views of a portion on a substrate, schematically illustrating a fabrication process for forming an insulating layer over the substrate, which includes a FOX structure, according to a first preferred embodiment of the invention. In FIG. 3A, a FOX layer 316 is formed on a surface of a semiconductor substrate 300 to isolate a MOS transistor 305, which includes a gate structure 315, two interchangeable source/drain regions 312, 314. The gate structure 315 includes a gate 310 on the substrate 300 and a spacer 311 on each side of the gate 310. The interchangeable source/drain regions 312, 314 have a lightly doped drain (LDD) structure.

In FIG. 3B, a first insulating layer 320 is formed over the substrate 300 so that the MOS transistor 305 of FIG. 3A and the FOX layer 316 is covered by the first insulating layer 320. The formation of the first insulating layer 320 includes a CVD process and preferably includes an atmospheric CVD (APCVD) process or a sub-atmospheric CVD (SAPCVD) process. The first insulating layer 320 includes, for example, non-doped glass (NSG), which is formed by, for example, using a reaction gas mixed by $TEOS/O_2/O_3N_2$ in the CVD process at an operation temperature of about 200° C.–350° C., and has a thickness of about 500 Å–5000 Å. Since the first insulating layer 320 is formed at a lower temperature and has smaller thickness, a thickness with sufficient uniformity is achieved.

Figure 1A:
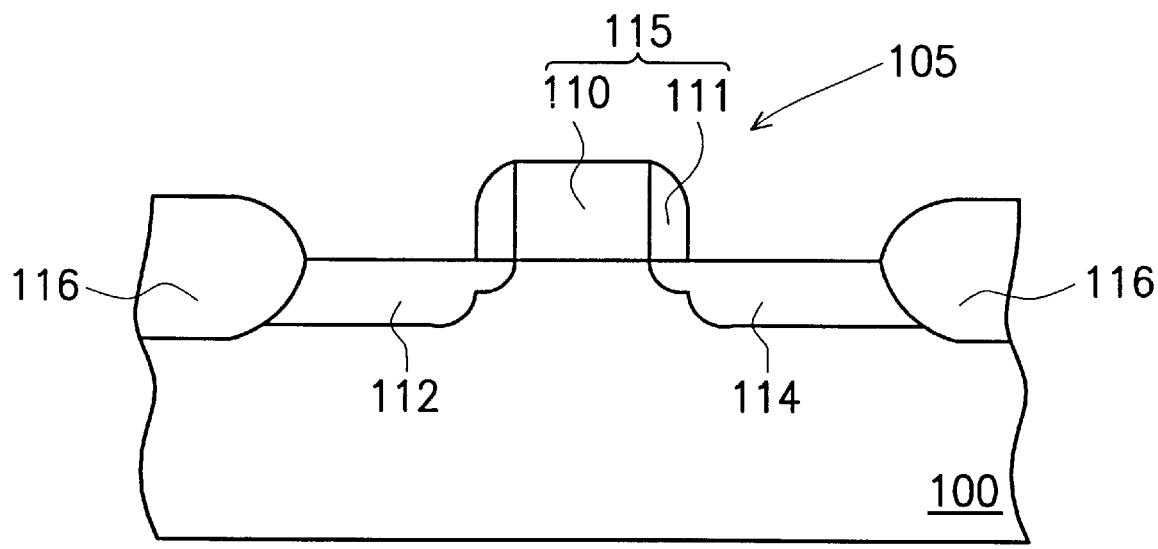
FIG. 1A and FIG. 1B are cross-section views of a portion on a substrate, schematically illustrating a conventional fabrication process for forming an insulating layer over the substrate that includes a FOX structure.
Figure 1B:
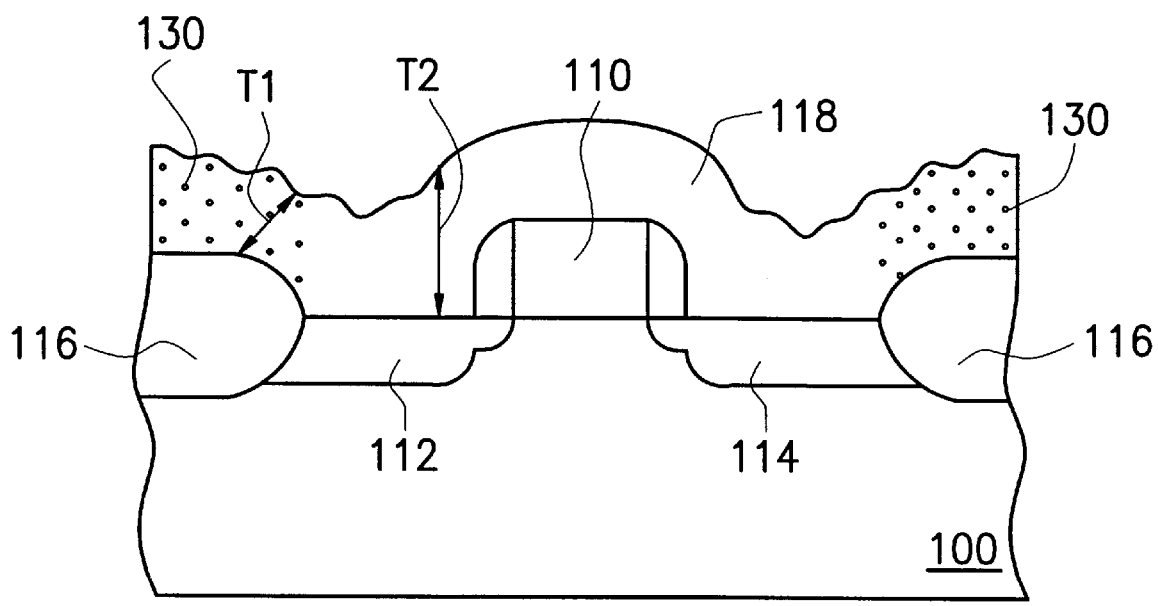
Figure 2A:
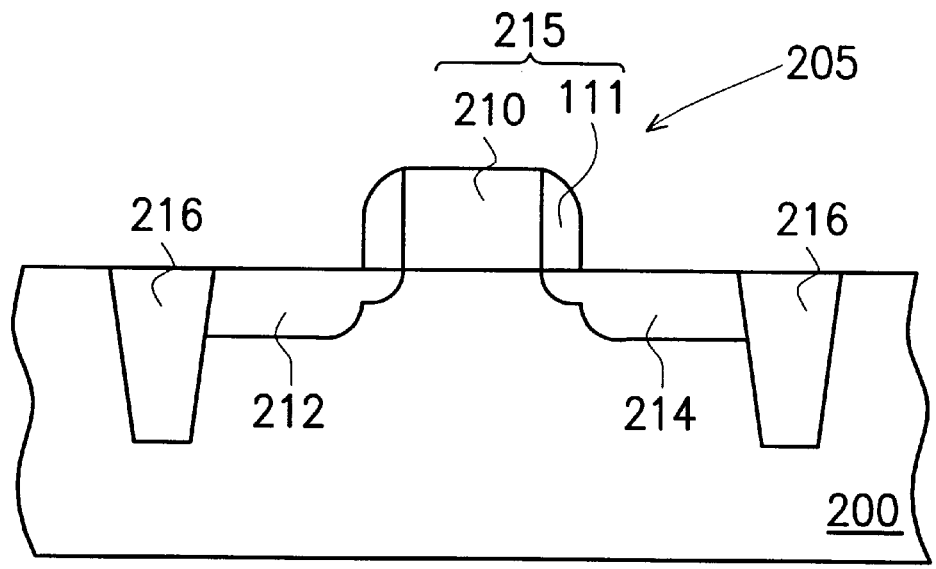
FIG. 2A and FIG. 2B are cross-section views of a portion on a substrate, schematically illustrating a conventional fabrication process for forming an insulating layer over the substrate that includes a STI structure.
Figure 2B:
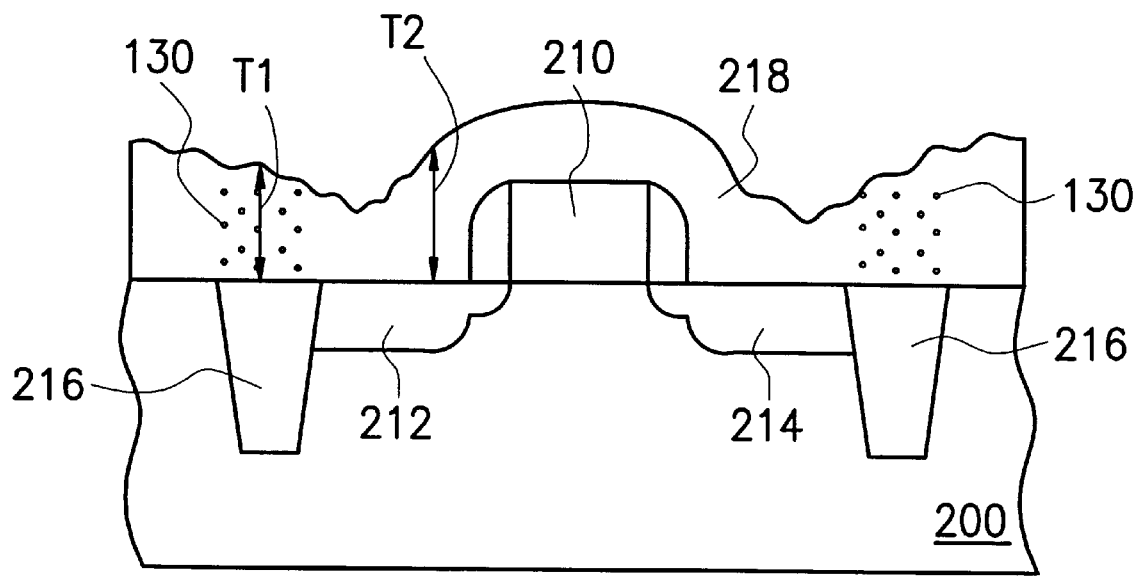

In FIG. 3C, a second insulating layer 322 is formed over the first insulating layer 320. The second insulating layer 322 includes, for example, non-doped glass (NSG), which is formed by, for example, using a reaction gas mixed by $TEOS/O_2/O_3N_2$ in the CVD process at an operation temperature of about 350° C.–500° C., and has a thickness of about 1000 Å–10000 Å. The thickness of the second insulating layer depends on the thickness of the first insulating layer in order to form a sufficient thickness for the purpose of insulation. Since the second insulating layer is formed over the first insulating layer, there is no interface between the second insulating layer 322 and the substrate 300. This allows the second insulating layer 322 can be formed with a sufficient uniformity and without an occurrence of voids 130 of FIG. 1B. In addition, since the first insulating layer has a uniform thickness, the surface sensitivity T1/T2 is about equal to one.

Example 2

Figure 4A:
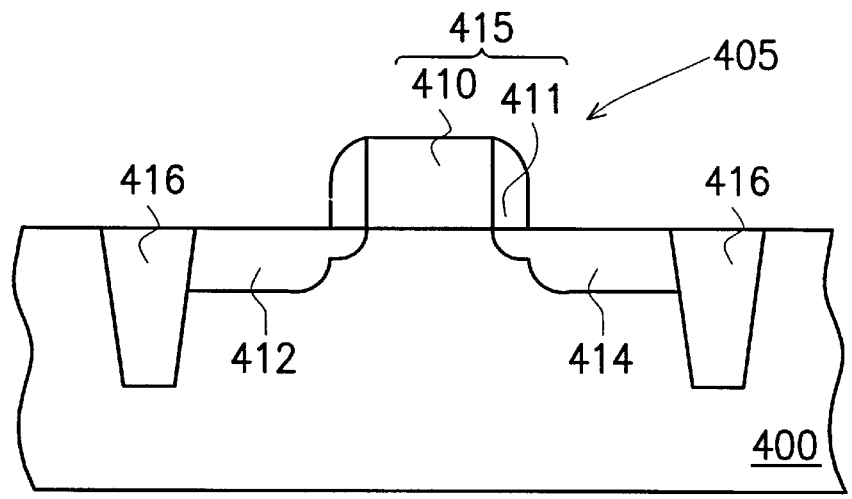
FIGS. 4A–4C are cross-section views of a portion on a substrate, schematically illustrating a fabrication process for forming an insulating layer over the substrate, which includes a STI structure, according to a second preferred embodiment of the invention.

FIGS. 4A–3C are cross-section views of a portion on a substrate, schematically illustrating a fabrication process for forming an insulating layer over the substrate, which includes a STI structure, according to a second preferred embodiment of the invention. In FIG. 4A, a STI structure 416 including, for example, silicon dioxide, is formed on a surface of a semiconductor substrate 400 to isolate a MOS transistor 405, which includes a gate structure 415, two interchangeable source/drain regions 412, 414. The gate structure 415 includes a gate 410 on the substrate 400 and a spacer 411 on each side of the gate 410. The interchangeable source/drain regions 412, 414 have a lightly doped drain (LDD) structure.

Figure 4B:
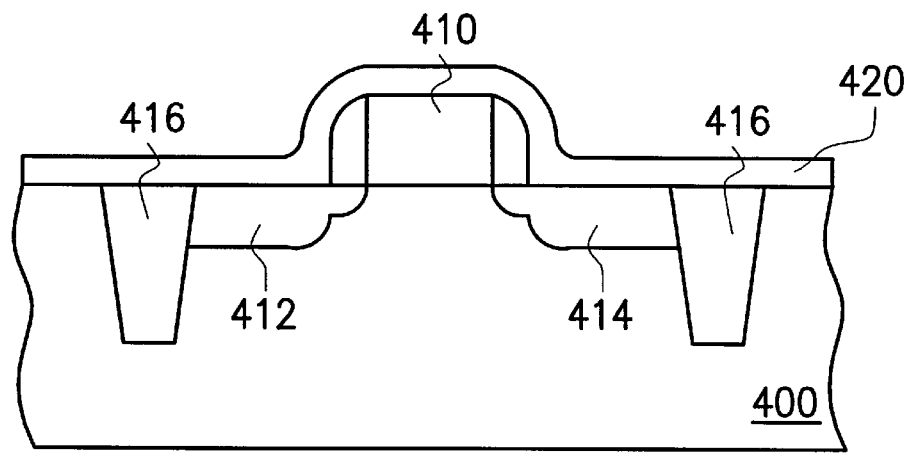

In FIG. 4B, a first insulating layer 420 is formed over the substrate 400 so that the MOS transistor 405 of FIG. 4A and the STI structure 416 is covered by the first insulating layer 420. The formation of the first insulating layer 420 includes a CVD process and preferably includes an atmospheric CVD (APCVD) process or a sub-atmospheric CVD (SAPCVD) process. The first insulating layer 420 includes, for example, non-doped glass (NSG), which is formed by, for example, using a reaction gas mixed by $TEOS/O_2/O_3N_2$ in the CVD process at an operation temperature of about 200° C.–350° C., and has a thickness of about 500 Å–5000 Å. Since the first insulating layer 420 is formed at a lower temperature and has smaller thickness, a thickness with sufficient uniformity is achieved.

Figure 4C:
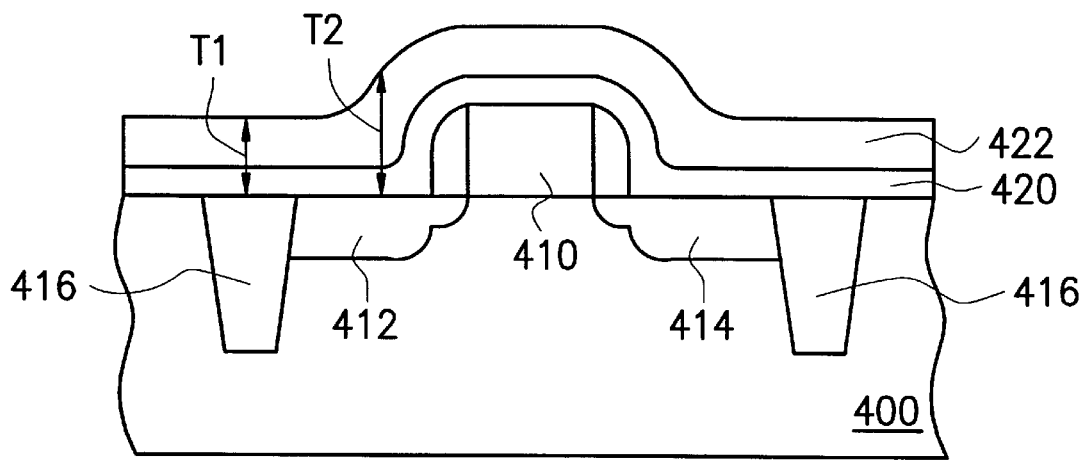

In FIG. 4C, a second insulating layer 422 is formed over the first insulating layer 420. The second insulating layer 422 includes, for example, non-doped glass (NSG), which is formed by, for example, using a reaction gas mixed by $TEOS/O_2/O_3/N_2$ in the CVD process at an operation temperature of about 350° C.–500° C., and has a thickness of about 1000 Å–10000 Å. The thickness of the second insulating layer depends on the thickness of the first insulating layer in order to form a sufficient thickness for the purpose of insulation. Since the second insulating layer is formed over the first insulating layer, there is no interface between the second insulating layer 422 and the substrate 400. This allows the second insulating layer 422 can be formed with a sufficient uniformity and without an occurrence of voids 130 of FIG. 1B. In addition, since the first insulating layer has a uniform thickness, the surface sensitivity T1/T2 is about equal to one even though it may be not if the location of T2 is chosen very near to the gate 410.

In the above descriptions of the invention, the insulating layers are, for example, formed over a substrate, which has a MOS transistor and an isolation structure, such as FOX or STI. In a wider situation, the insulating layer of the invention can applied to any formation, in which the insulating layer is to be formed over a surface having at least two different types of interfaces. A thinner insulating layer is formed first with easier control of uniform thickness. A second insulating layer then is formed over the first insulating layer to have better quality and has a single interface. The thickness of the second insulating layer depends on an actual need to perform the purpose of insulating function. The first insulating layer can even included a material other than the desires material for the second insulating layer, which serves as the main body of the whole insulating layer.

In conclusion, the invention for forming an insulating layer over a MOS transistor and its isolation structure has several characteristics as follows:

1. Voids are effectively prevented from occurring on the second insulating layer formed over the first insulating layer so that the insulating layer does not absorb water vapor above isolation structures of FOX or STI to degrade its isolation capability.

2. Since the second insulating layer is formed over the first insulating layer, there is no interface between the substrate and the second insulating layer. This allows a uniform thickness to be achieved. The surface sensitivity T1/T2 is about equal to one. A measured data shows that T1 is about 450 Å and T2 is about 5000 Å. The surface sensitivity T1/T2 results in about 99%.

3. The first insulating layer is formed in a lower temperature with smaller thickness so that the first insulating layer can be easily formed over the substrate with a uniform thickness and has sufficient step coverage capability. This allows the second insulating layer also to be easily formed in a usually higher temperature and greater thickness. The thickness and the step coverage capability are maintained at a sufficient good level, which can not be achieved by the conventional fabrication method.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming an insulating layer, the method comprising:

providing a substrate, which further comprises an exposed oxide structure;

forming a first insulating layer over the substrate at a first temperature, wherein the first insulating layer comprises non-doped silicate glass; and forming a second insulating layer over the first insulating layer at a second temperature.

2. The method of claim 1, wherein the exposed oxide structure comprises a field oxide (FOX) structure.

3. The method of claim 1, wherein the exposed oxide structure comprises a shallow trench isolation (STI) structure.

4. The method of claim 1, wherein the step of forming the first insulating layer comprises chemical vapor deposition (CVD).

5. The method of claim 4, wherein the step of forming the first insulating layer comprises atmospheric CVD (APCVD).

6. The method of claim 4, wherein the step of forming the first insulating layer comprises sub-atmospheric CVD (SAPCVD).

7. The method of claim 1, wherein in the step of forming the first insulating layer, the first temperature is about 200° C.–350° C.

8. The method of claim 1, wherein the first insulating layer comprises a thickness of about 500 Å–5000 Å.

9. The method of claim 1, wherein the first insulating layer comprises tetra-ethyl-ortho-silicate (TEOS) silicon oxide.

10. The method of claim 1, wherein the step of forming the second insulating layer comprises chemical vapor deposition (CVD).

11. The method of claim 10, wherein the step of forming the second insulating layer comprises atmospheric CVD (APCVD).

12. The method of claim 10, wherein the step of forming the second insulating layer comprises sub-atmospheric CVD (SAPCVD).

13. The method of claim 1, wherein in the step of forming the second insulating layer, the second temperature is about 350° C.–500° C.

14. The method of claim 1, wherein the second insulating layer comprises a thickness of about 1000 Å–10000 Å.

15. The method of claim 1, wherein the second insulating layer comprises non-doped silicate glass.

16. The method of claim 1, wherein the second insulating layer comprises tetra-ethyl-ortho-silicate (TEOS) silicon oxide.

17. A method for forming an insulating layer, the method comprising:

providing a substrate having at least two exposed structures made of different materials;

forming a first insulating layer over the substrate at a first temperature; and forming a second insulating layer over the first insulating layer at a second temperature, wherein the second insulating layer comprises non-doped silicate glass.

18. The method of claim 1, wherein the substrate comprises a metal-oxide semi-conductor (MOS) transistor and a field oxide (FOX) isolation structure.

19. The method of claim 1, wherein the substrate comprises a metal-oxide semi-conductor (MOS) transistor and a shallow trench isolation (STI) structure.

20. A method for forming an insulating layer comprising the steps of:

providing a substrate having an exposed oxide structure;

forming a first insulating layer over the substrate at a first temperature and first thickness; and forming a second insulating layer over the first insulating layer at a second temperature and a second thickness;

wherein the first insulating layer and the second insulating layer are formed from substantially same materials, the second temperature is higher than the first temperature, and the second thickness is larger than the first thickness.

* * * * *